United States Patent
Ku et al.

(10) Patent No.: US 9,997,384 B2
(45) Date of Patent: Jun. 12, 2018

(54) METHODS FOR TRANSPORTING WAFERS BETWEEN WAFER HOLDERS AND CHAMBERS

(75) Inventors: Shao-Yen Ku, Jhubei (TW); Ming-Jung Chen, Hsin-Chu (TW); Tzu Yang Chung, Hsin-Chu (TW); Chi-Yun Tseng, Longtan Township (TW); Rui-Ping Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1041 days.

(21) Appl. No.: 13/309,283

(22) Filed: Dec. 1, 2011

(65) Prior Publication Data
US 2013/0142594 A1   Jun. 6, 2013

(51) Int. Cl.
*H01L 21/67* (2006.01)

(52) U.S. Cl.
CPC ................ *H01L 21/67201* (2013.01)

(58) Field of Classification Search
CPC ......... H01L 21/67742; H01L 21/68707; H01L 21/67772; H01L 21/67201; H01L 21/67748; H01L 21/67769; H01L 21/67775
USPC ........................................ 414/217, 939, 940
See application file for complete search history.

(56) References Cited

U.S. PATENT DOCUMENTS

| | | | | |
|---|---|---|---|---|
| 4,966,519 A * | 10/1990 | Davis | ................ | H01L 21/67201 118/500 |
| 5,044,871 A * | 9/1991 | Davis | ................ | H01L 21/67201 118/500 |
| 5,292,393 A * | 3/1994 | Maydan | ............ | H01L 21/67201 118/715 |
| 5,378,283 A * | 1/1995 | Ushikawa | ........... | C23C 16/4401 118/715 |
| 5,486,080 A * | 1/1996 | Sieradzki | ....................... | 414/217 |
| 5,628,828 A * | 5/1997 | Kawamura | ......... | C23C 16/4412 118/719 |
| 5,697,749 A * | 12/1997 | Iwabuchi et al. | ............. | 414/217 |
| 5,740,034 A * | 4/1998 | Saeki | .................... | H01L 21/681 356/601 |
| 5,769,588 A * | 6/1998 | Toshima et al. | .............. | 414/217 |
| 5,934,856 A * | 8/1999 | Asakawa | ................ | C23C 16/54 414/217 |
| 5,971,696 A * | 10/1999 | Endo et al. | ..................... | 414/778 |
| 6,071,055 A * | 6/2000 | Tepman | ...................... | 414/217 |
| 6,106,582 A * | 8/2000 | Heyder et al. | ............... | 29/25.01 |
| 6,176,667 B1 * | 1/2001 | Fairbairn | .......... | H01L 21/67017 414/217 |
| 6,201,999 B1 * | 3/2001 | Jevtic | ............................ | 700/100 |
| 6,352,467 B1 * | 3/2002 | Somekh et al. | ................ | 451/28 |
| 6,454,508 B2 * | 9/2002 | Toshima et al. | .............. | 414/217 |
| 6,454,519 B1 * | 9/2002 | Toshima et al. | .............. | 414/805 |
| 6,467,491 B1 | 10/2002 | Sugiura et al. | | |
| 6,566,269 B1 | 5/2003 | Biles et al. | | |
| 6,913,654 B2 | 7/2005 | Alvarez, Jr. et al. | | |

(Continued)

*Primary Examiner* — Glenn F Myers
(74) *Attorney, Agent, or Firm* — Slater Matsil, LLP

(57) ABSTRACT

An apparatus comprises a process chamber, and a loadlock connected to the process chamber. The loadlock is configured to have a wafer holder disposed therein. The wafer holder is configured to store a plurality of wafers, and is configured to transport the plurality of wafers away from the loadlock.

20 Claims, 18 Drawing Sheets

(56) References Cited

U.S. PATENT DOCUMENTS

| | | | |
|---|---|---|---|
| 6,996,453 B2* | 2/2006 | Ahn et al. | 700/213 |
| 7,189,291 B2 | 3/2007 | Spiegelman et al. | |
| 7,249,925 B2* | 7/2007 | del Puerto | B82Y 10/00 |
| | | | 414/331.14 |
| 7,815,739 B2* | 10/2010 | Matsuura | 118/719 |
| 8,616,821 B2 | 12/2013 | Ku et al. | |
| 8,870,512 B2* | 10/2014 | Rice et al. | 414/217 |
| 2001/0026747 A1* | 10/2001 | Saga | H01L 21/67772 |
| | | | 414/200 |
| 2003/0012626 A1* | 1/2003 | Aggarwal | 414/217.1 |
| 2004/0091349 A1* | 5/2004 | Tabrizi | H01L 21/67126 |
| | | | 414/804 |
| 2006/0013674 A1* | 1/2006 | Elliott | H01L 21/67379 |
| | | | 414/222.01 |
| 2007/0175395 A1* | 8/2007 | Oh | C23C 16/4408 |
| | | | 118/719 |
| 2008/0236488 A1* | 10/2008 | Takeshita | C23C 16/4401 |
| | | | 118/719 |
| 2011/0168330 A1* | 7/2011 | Sakaue | H01L 21/67109 |
| | | | 156/345.31 |
| 2011/0229289 A1* | 9/2011 | Nogi | H01L 21/67745 |
| | | | 414/217 |

* cited by examiner

METHODS FOR TRANSPORTING WAFERS BETWEEN WAFER HOLDERS AND CHAMBERS

BACKGROUND

Existing integrated circuit (IC) manufacturing lines typically include large clean rooms and some manufacturing tools in the clean rooms, while other tools, such as the tools that are used for metrologies and/or wafer transferring/transporting/exchanging paths, are within relatively open environments. When exposed to the open environment, wafers are vulnerable to the attacks of adverse substances such as moisture, oxygen, and various airborne molecular contaminants (AMC) sources, which include etching byproduct solvents, perfumes, storage materials, chamber residual gases, etc. An example of the AMCs is dimethyl sulfide (DMS), which is a chemical commonly used in the semiconductor manufacturing processes.

As the semiconductor processes precede into the nanometer domain, the negative effects of adverse substances on IC manufacturing become increasingly more severe. For example, in some critical stages, AMCs have posted serious problems impacting either device performance or metrology accuracy. Furthermore, in the formation of copper features in metallization layers, due to the very small size of copper features, the reaction caused by oxygen, moisture, and the AMC sources causes an increase in RC delay of the manufactured integrated circuits, and sometimes a reduction in production yield. Low-k dielectric materials for forming metallization layers are also vulnerable to the attack of chemicals such as acids.

Existing IC manufacturing lines do not provide effective means for protecting wafers from the above-discussed problems. Therefore, methods have been explored to reduce the adverse substances. For example, efforts have been made to reduce the interval (Q time) between process stages. Cassettes or Front Opening Unified Pod (FOUP) were also periodically cleaned to remove possible adverse substances.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A method for transporting wafers and processing the wafers in a process chamber and the apparatus for performing the same are provided in accordance with various embodiments. The intermediate stages of transporting and processing wafers are illustrated. The variations and the operation of the embodiments are discussed. Throughout the various views and illustrative embodiments, like reference numbers are used to designate like elements.

Figure 1:
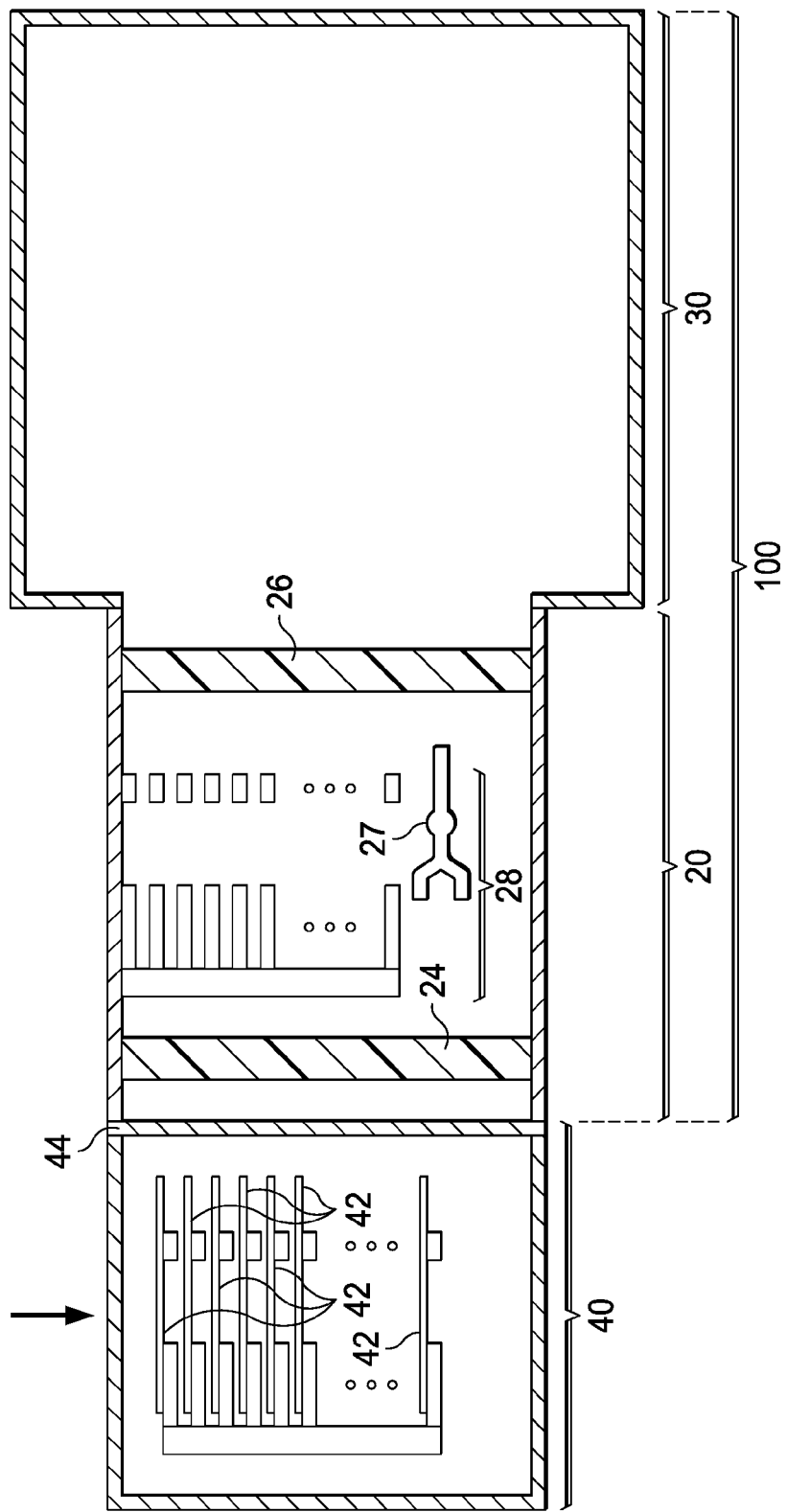
FIGS. 1 through 9 are cross-sectional views of intermediate stages in the transportation and the processing of wafers in accordance with various embodiments, wherein wafers in a wafer holder are stored in a loadlock when the wafers are processed in a process chamber.

Referring to FIG. 1, production tool 100 is provided. Production tool 100 includes process chamber 30, which can be vacuumed. Process chamber 30 is configured to process wafers, and may perform functions such as deposition, plasma treatment, etching, or the like, on the wafers. The process may be performed in a vacuum environment, which has a pressure lower than one atmosphere, 100 Torr, 1 Torr, or even lower. Loadlock 20 is connected to process chamber 30, and is configured to load wafers into process chamber 30, and unload the wafers from process chamber 30. Robot 27, which is schematically illustrated, may be disposed in loadlock 20, and may be used for transferring the wafers.

Loadlock 20 includes doors 24 and 26, which are capable of sealing loadlock 20, so that loadlock 20 may be vacuumed. Loadlock 20 further includes wafer storage 28, which may include a plurality of shelves, each configured to store one wafer. Wafer storage 28 may be configured to store 10, 20, or more wafers at the same time. In an exemplary embodiment, wafer storage 28 may store about 25 wafers or more.

Wafer holder 40, which may be a wafer cassette, a front opening unified pod (FOUP), or the like, is used to hold wafers 42, with each wafer 42 placed on one of shelves in wafer holder 40. Wafer holder 40 may be used to transport wafers in open air, and wafers 42 may be stacked and stored therein, for example. Wafer holder 40 may be configured to hold 10, 20, or more wafers at the same time. In an exemplary embodiment, wafer holder 40 may about hold 25 wafers or more. Wafer holder 40 is first aligned to and locked to loadlock 20, with door 44 of wafer holder 40 facing door 24 of loadlock 20. The sizes of doors 44 and 24 may be close to each other, and are large enough for wafers 42 to be transported between wafer holder 40 and loadlock 20. Doors 24 and 44 may be sliding doors.

Figure 2:
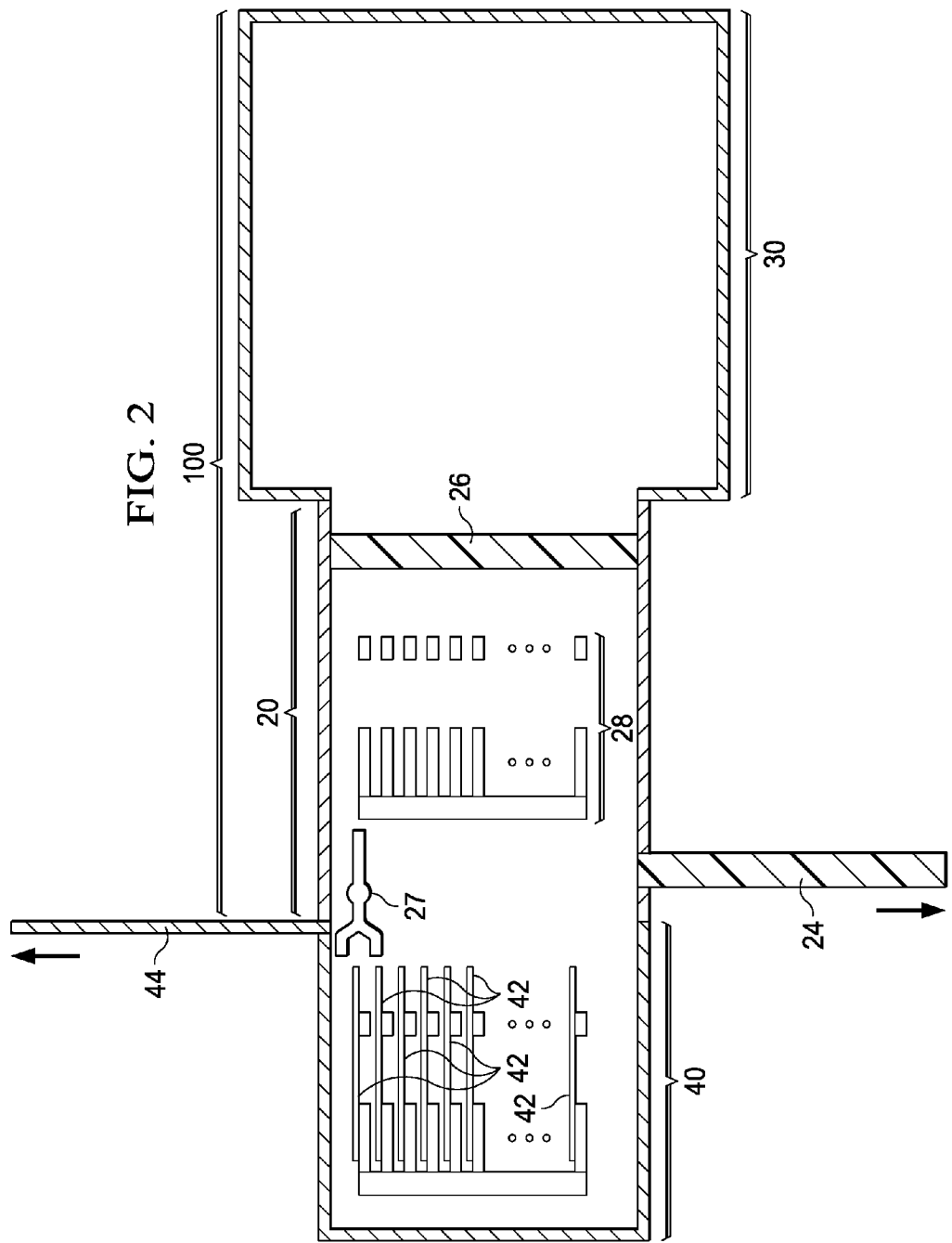
Figure 3:
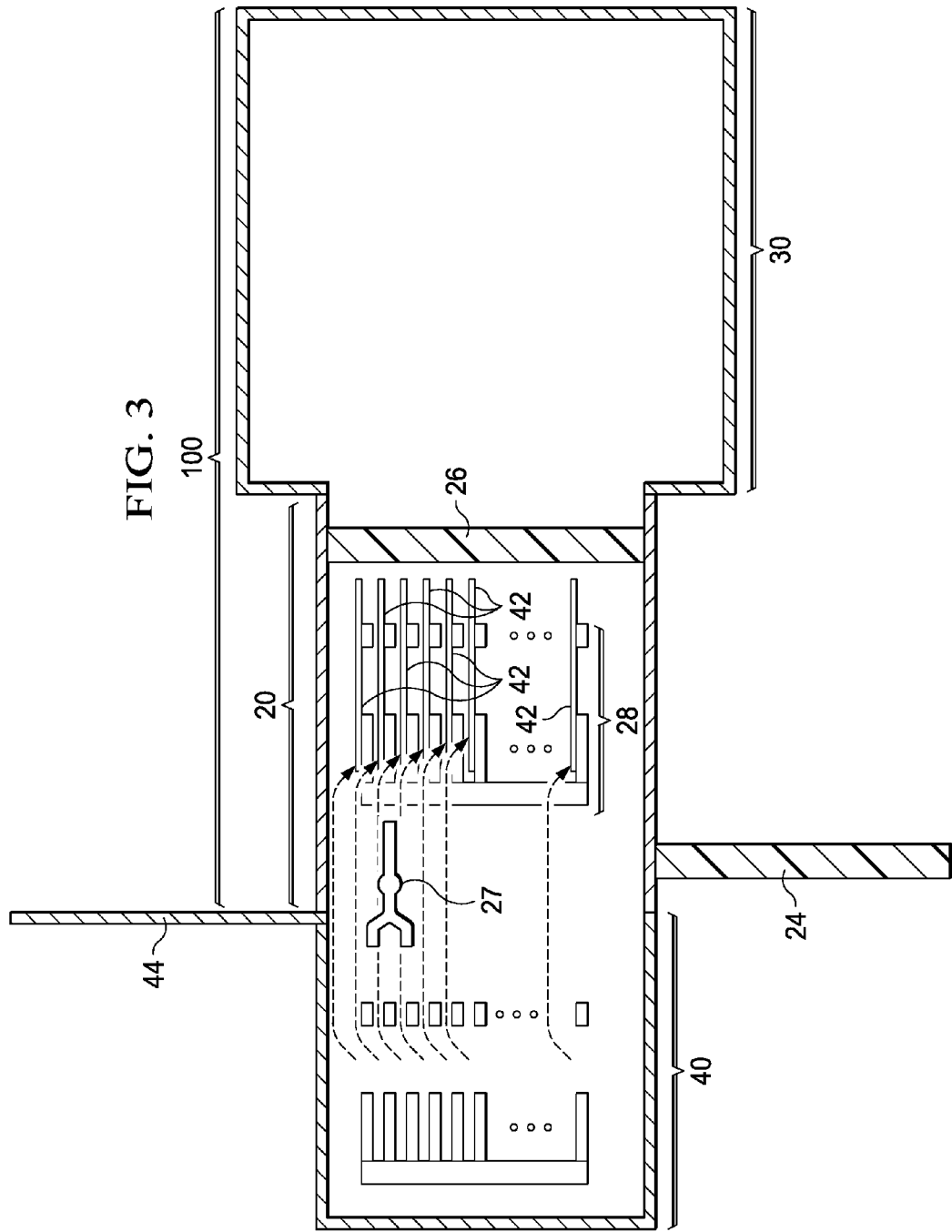

Referring to FIG. 2, door 44 of wafer holder 40 and door 24 of loadlock 20 are opened. Next, as shown in FIG. 3, at least some, and possibly all of wafer 42 are transported to wafer storage 28 in loadlock 20, wherein each of wafers 42 may be placed on one of the shelves of wafer storage 28. The transferring of wafers may be performed by robot 27.

Figure 4:
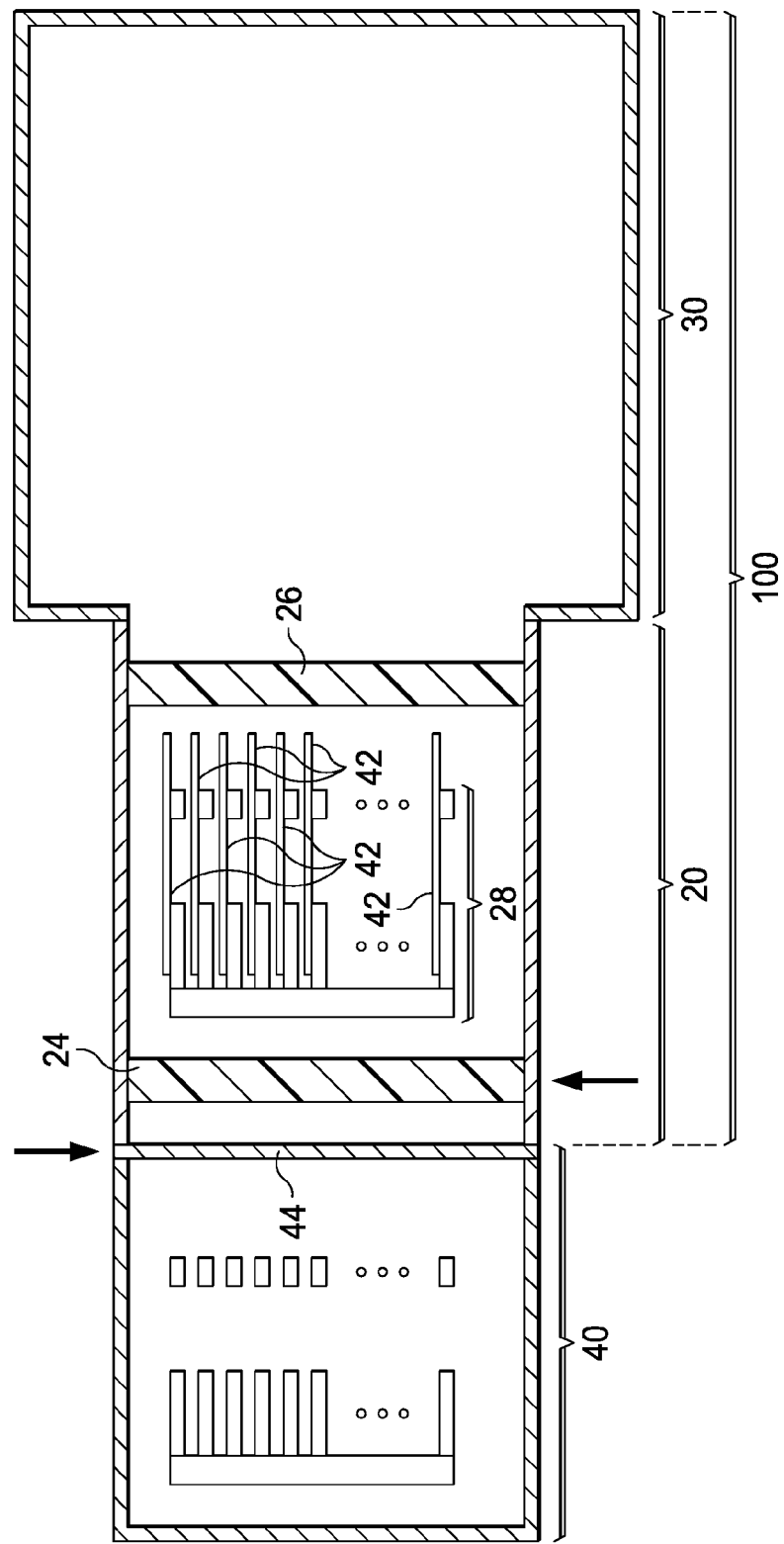

After all wafers 42 are transferred into loadlock 20, door 24 of loadlock 20 is closed, as shown in FIG. 4. Door 44 of wafer holder 40 may also be closed. Alternatively, door 44 may be left open. Loadlock 20 is then vacuumed, until the internal pressure of loadlock 20 is lower than a preset low-pressure, which may be lower than about 100 Torr, 10 Torr, 1 Torr, or even lower, depending on the requirement of process chamber 30.

Figure 5:
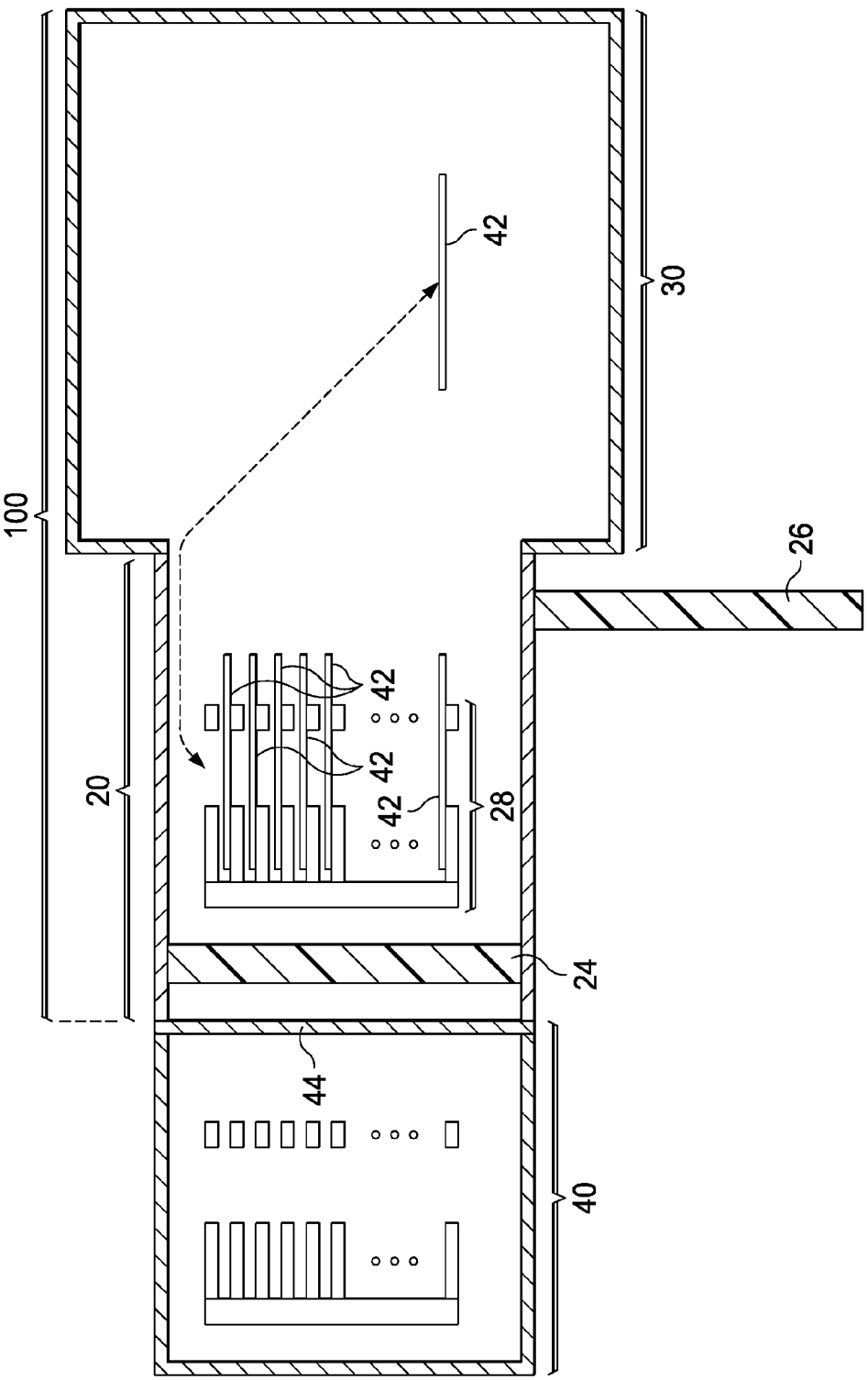

Next, referring to FIG. 5, door 26 of loadlock 20 is opened, so that the inner space of loadlock 20 and the inner space of process chamber 30 are joined. Accordingly, loadlock 20 and process chamber 30 share a same vacuum environment and are at a same pressure. A first wafer 42 is then transferred into process chamber 30 from wafer storage 28 in loadlock 20, so that the intended processing such as deposition, etching, treatment, or the like, may be performed on the first wafer 42 in process chamber 30. During the processing of first wafer 42, process chamber 30 may be at a low pressure, which may be lower than about 100 Torr, 10 Torr, or even lower. During the process of first wafer 42, door 26 may be opened or closed. After the processing, the first wafer 42 is transferred back to wafer storage 28 in loadlock 20.

Figure 6:
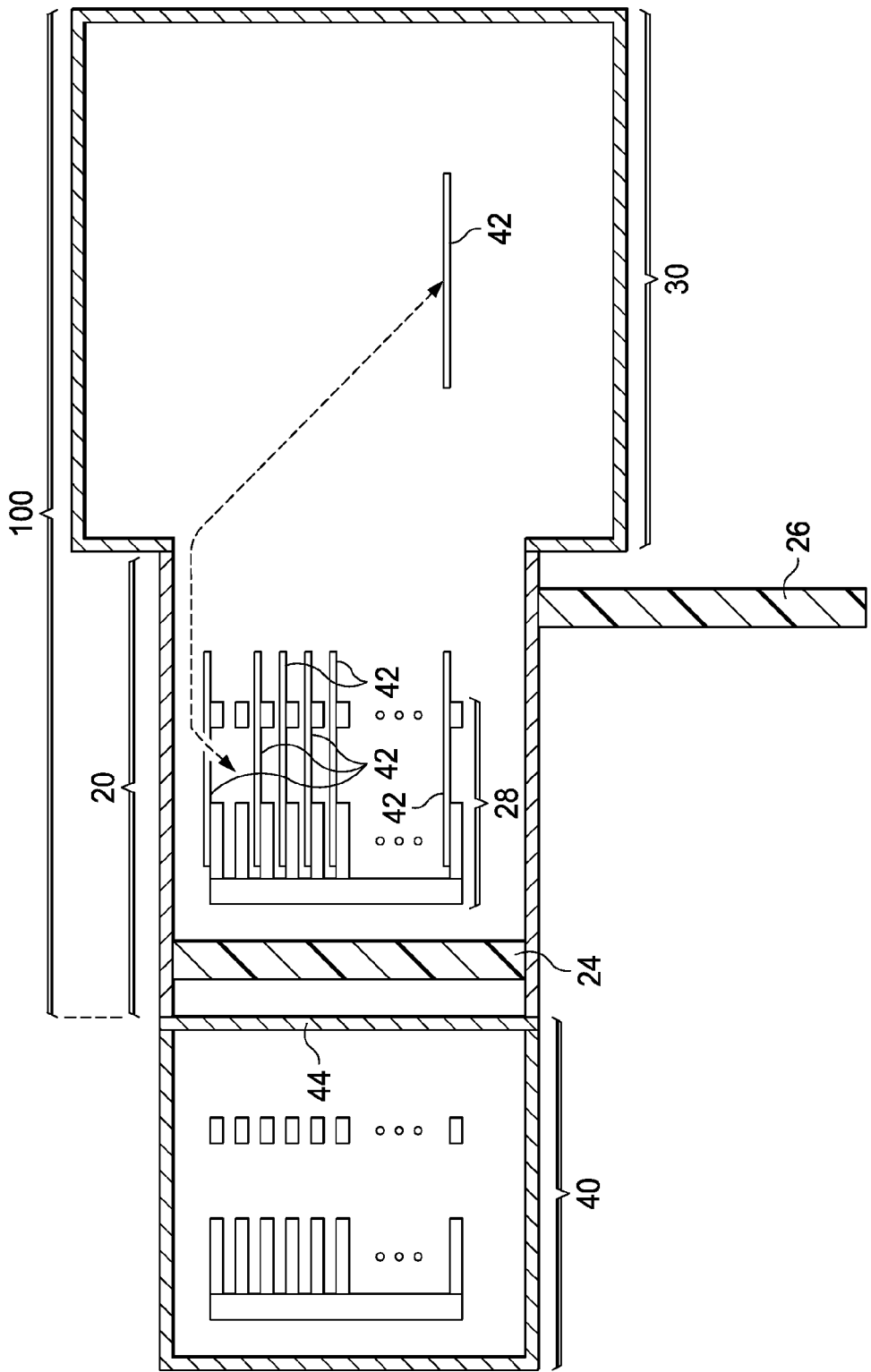

Referring to FIG. 6, a second wafer 42 is transferred into process chamber 30 from wafer storage 28 in loadlock 20, so that the intended processing such as deposition, etching, treatment, or the like, may be performed on the second wafer 42. During the processing of the second wafer 42, process chamber 30 may be under a low pressure, which may be lower than about 100 Torr, 10 Torr, or even lower. After the processing, the second wafer 42 is transferred back to wafer storage 28 in loadlock 20. The process is repeated, so that each of wafers 42 in loadlock 20 is transferred into process chamber 30 to perform the process, and then transferred back to wafer storage 28 in loadlock 20. It is noted that process chamber 30 may be able to process multiple wafers simultaneously. In which embodiments, several wafers 42 may be transferred into process chamber 30 to perform the process simultaneously, and then transferred back to wafer storage 28 in loadlock 20, until all of wafers 42 in loadlock 20 are processed.

Figure 7:
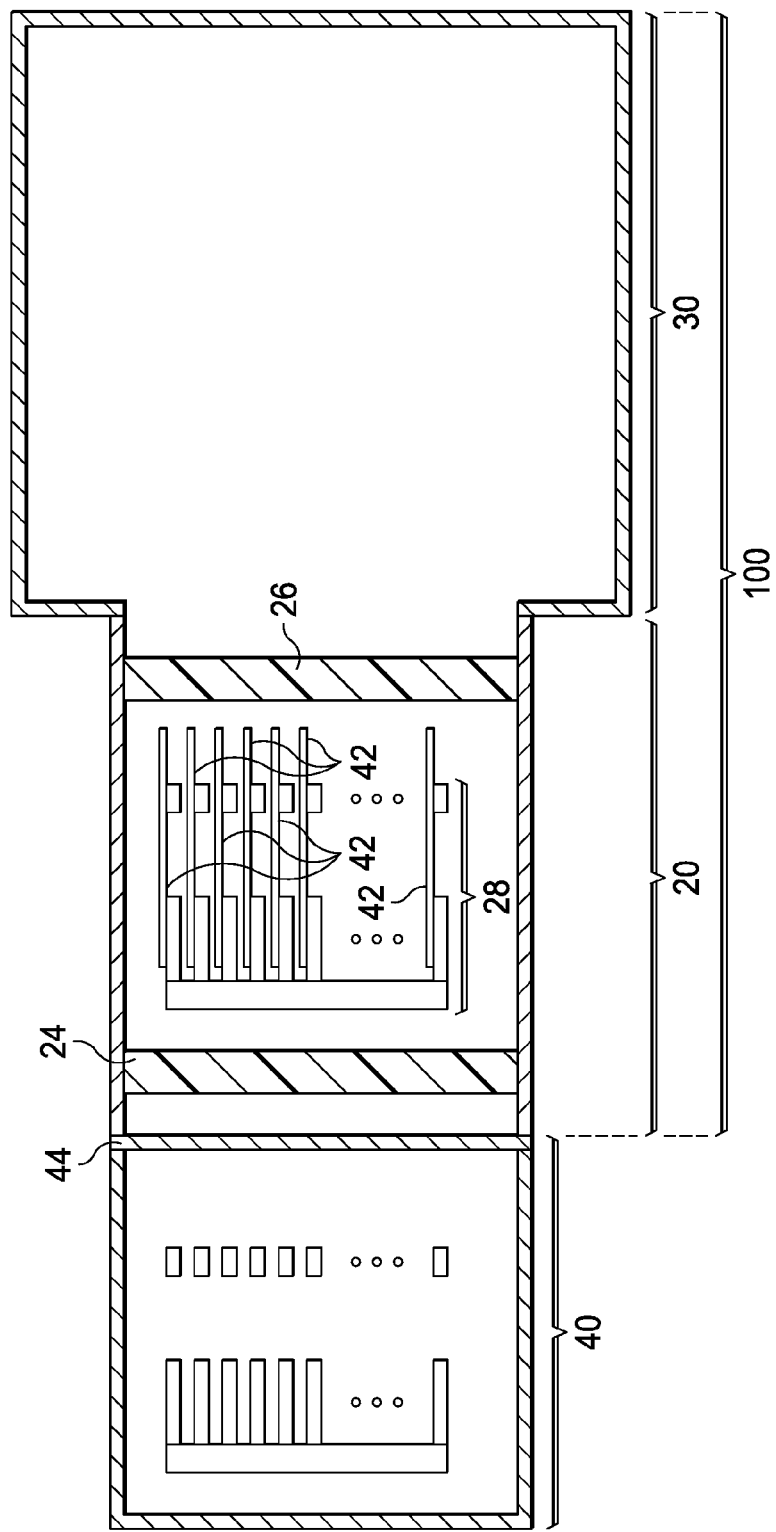
Figure 8:
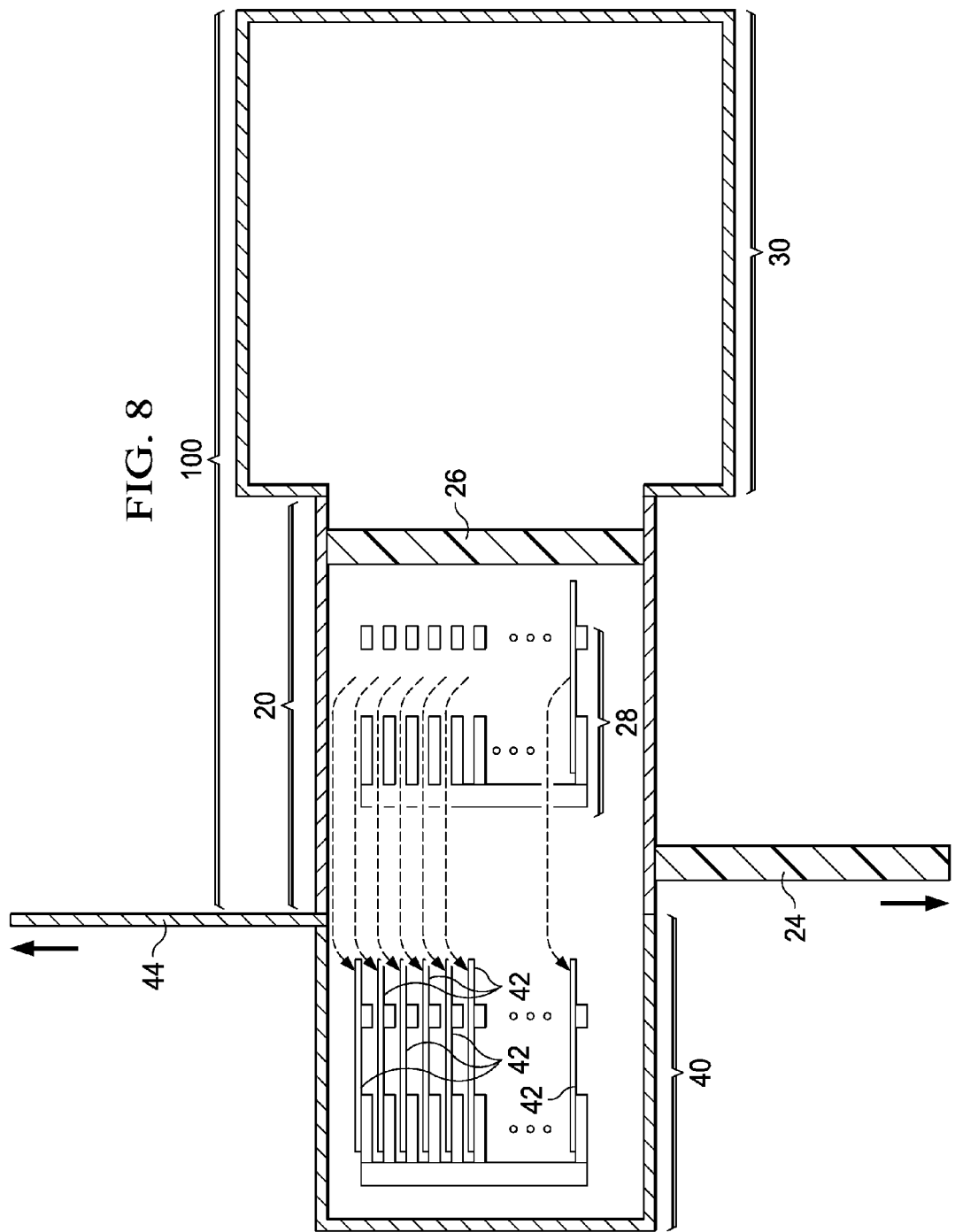
Figure 9:
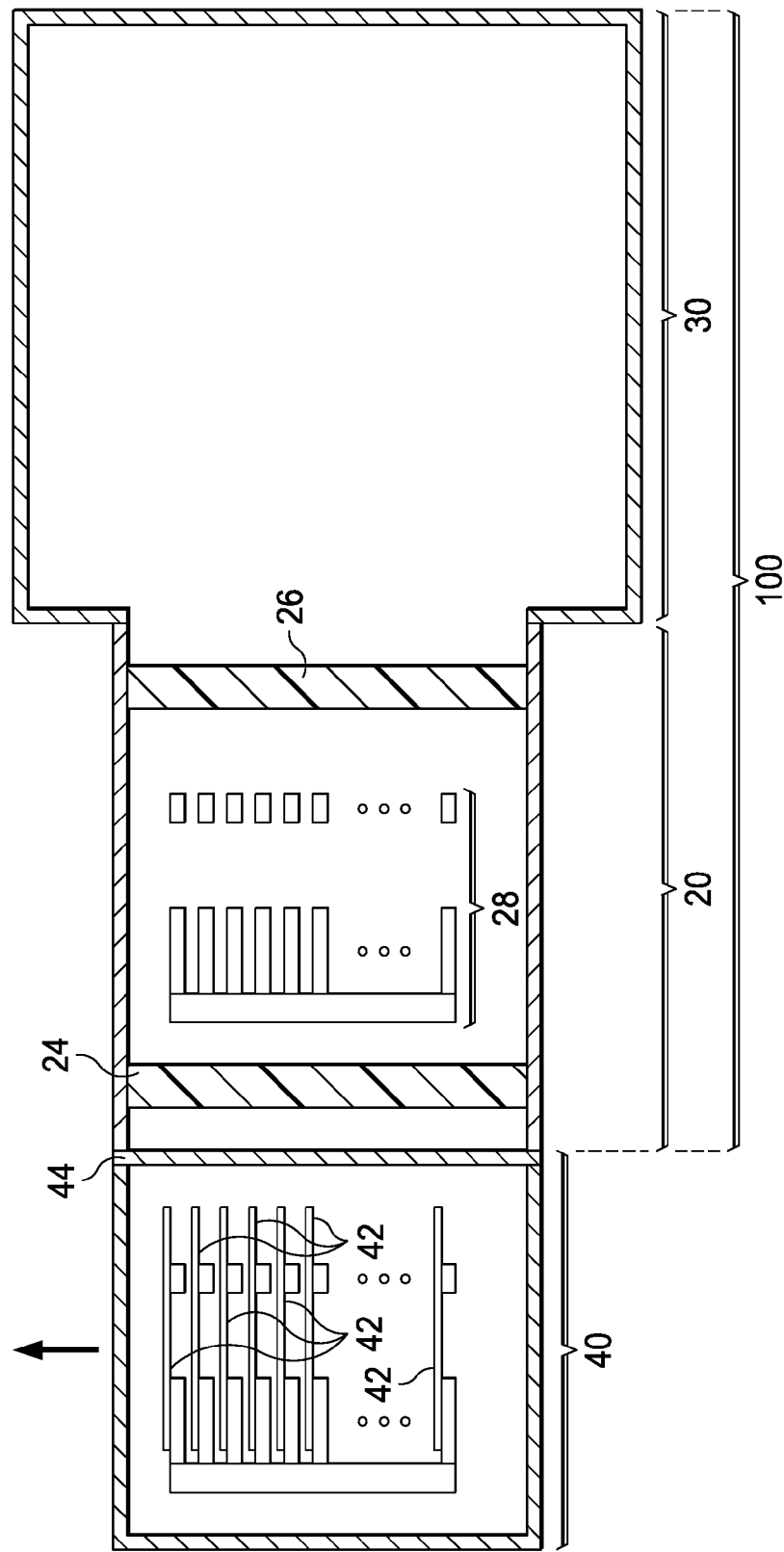

Referring to FIG. 7, door 26 of loadlock 20 is closed, and an inert gas such as nitrogen ($N_2$) is purged into loadlock 20, until the pressure in loadlock 20 reaches about one atmosphere. Door 24 of loadlock 20 and door 44 of wafer holder 40 are then opened, as shown in FIG. 8, and wafers 42 are transferred back into wafer holder 40. Next, as shown in FIG. 9, door 24 of loadlock 20 and door 44 of wafer holder 40 are closed. Wafer holder 40 may then be transported away, and another wafer holder (not shown, similar to wafer holder 40) may be locked onto loadlock 20, so that the wafers in the other wafer holder may be processed using essentially the same process as shown in FIGS. 1 through 9.

It is observed that during the entire period that wafers 42 are transferred into process chamber 30 and processed, the rest of wafers 42 that are not being processed reside in loadlock 20, which is vacuumed. Accordingly, detrimental substances that may damage wafers 42, including moisture and chemicals, cannot access wafers 42, and the defects and corrosion that may result from the detrimental substances are essentially eliminated.

FIGS. 10 through 15 illustrate cross-sectional views of intermediate stages in the transporting and processing of wafers in accordance with alternative embodiments. Unless specified otherwise, the materials and formation methods of the components in these embodiments are essentially the same as the like components, which are denoted by like reference numerals in the embodiment shown in FIGS. 1 through 9. In these embodiments, loadlock 20 may not have the wafer storage (such as wafer storage 28 in FIG. 9) residing therein.

Figure 10:
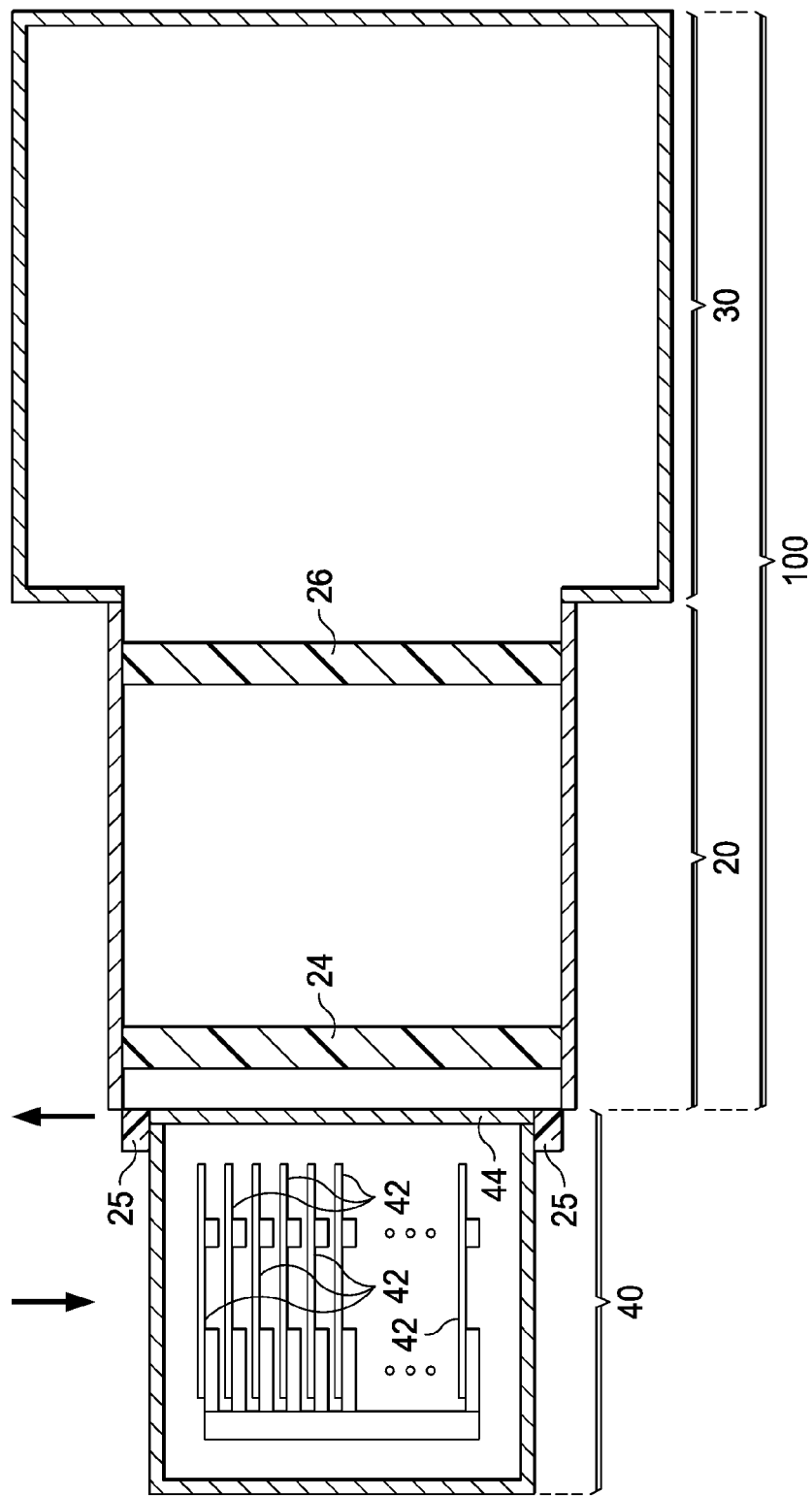
FIGS. 10 through 15 are cross-sectional views of intermediate stages in the transportation and the processing of wafers in accordance with various embodiments, wherein a wafer holder is vacuumed along with a loadlock when the wafers are processed in a process chamber.
Figure 11:
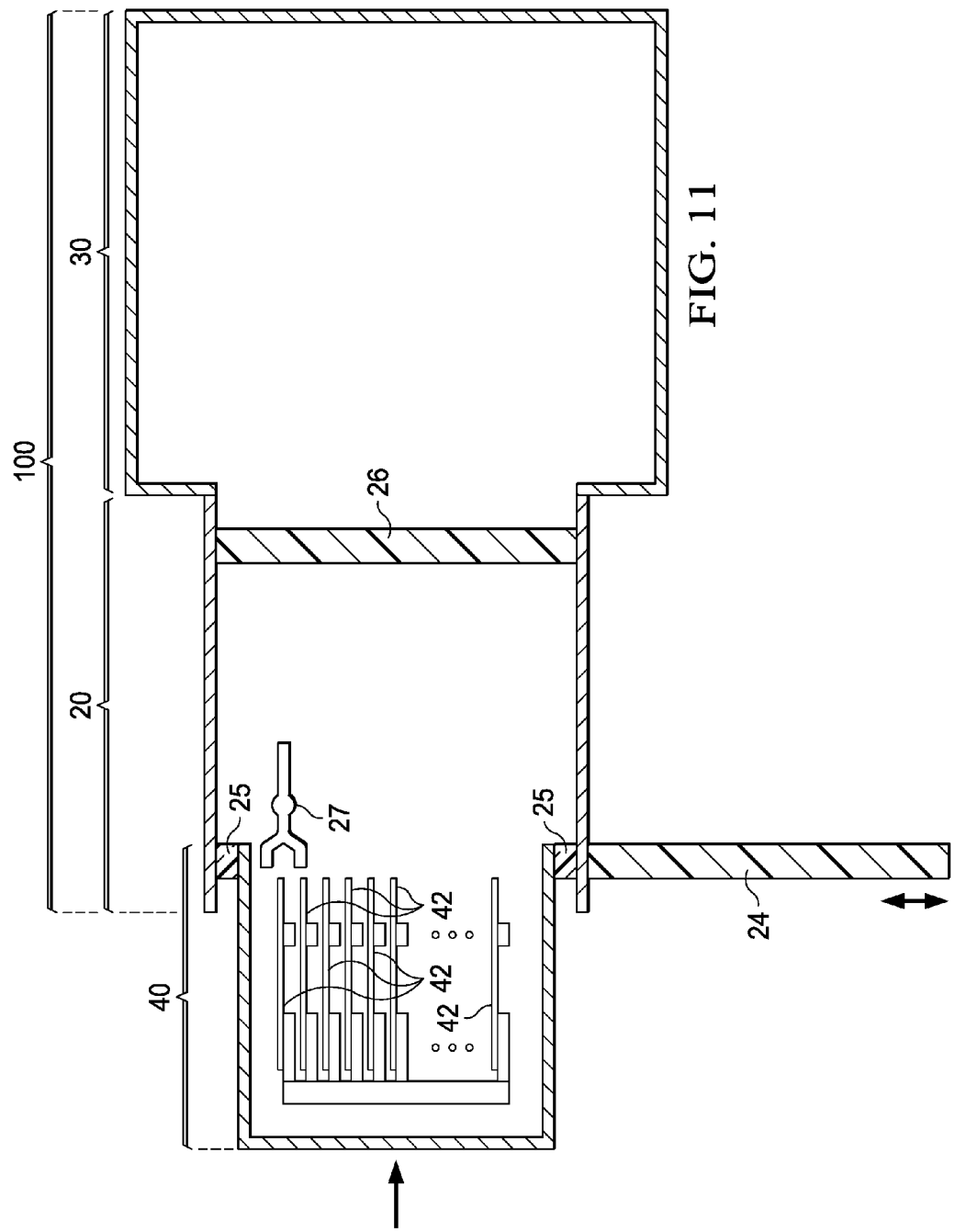

Referring to FIG. 10, wafer holder 40 is first aligned to, and then locked to, loadlock 20, with door 44 of wafer holder 40 facing door 24 of loadlock 20. Door 44 of wafer holder 40 is then opened. Next, as shown in FIG. 11, door 24 of loadlock 20 is opened, and wafer holder 40 is pushed into loadlock 20 slightly. A front portion of wafer holder 40 is inserted into the front portion of loadlock 20. Door 24 is then pushed back against sealing materials 25, which may be installed on the outer side of wafer holder 40 or the inner side of loadlock 20. Accordingly, the gaps between wafer holder 40 and loadlock 20 are sealed. As a result, the internal space of wafer holder 40 and the internal space of loadlock 20 are open to each other to form an integrated inner space, which is well sealed from the open air. In some embodiments, sealing materials 25 are formed of rubber, although other elastic materials such as plastic may also be used. The integrated inner space is then vacuumed to form an integrated vacuum environment.

In these embodiments, since wafer holder 40 is vacuumed, wafer holder 40 needs to be designed to fulfill the requirement of vacuuming. For example, the body of wafer holder 40 including the frame of wafer holder 40 needs to be able to withstand the pressure difference up to one atmosphere or little higher, which pressure difference occurs when the inner space is vacuumed. In some embodiments, wafer holder 40 may be formed of a metal(s) such as aluminum and stainless steel. Furthermore, wafer holder 40 is well sealed so that no leak occurs when the internal space of wafer holder 40 is vacuumed. In addition, sealers (such as sealer 25) may be installed either on the outer sides of wafer holder 40 or the inner sides of loadlock 20 to seal the joints between wafer holder 40 and the connecting loadlock 20.

Figure 12:
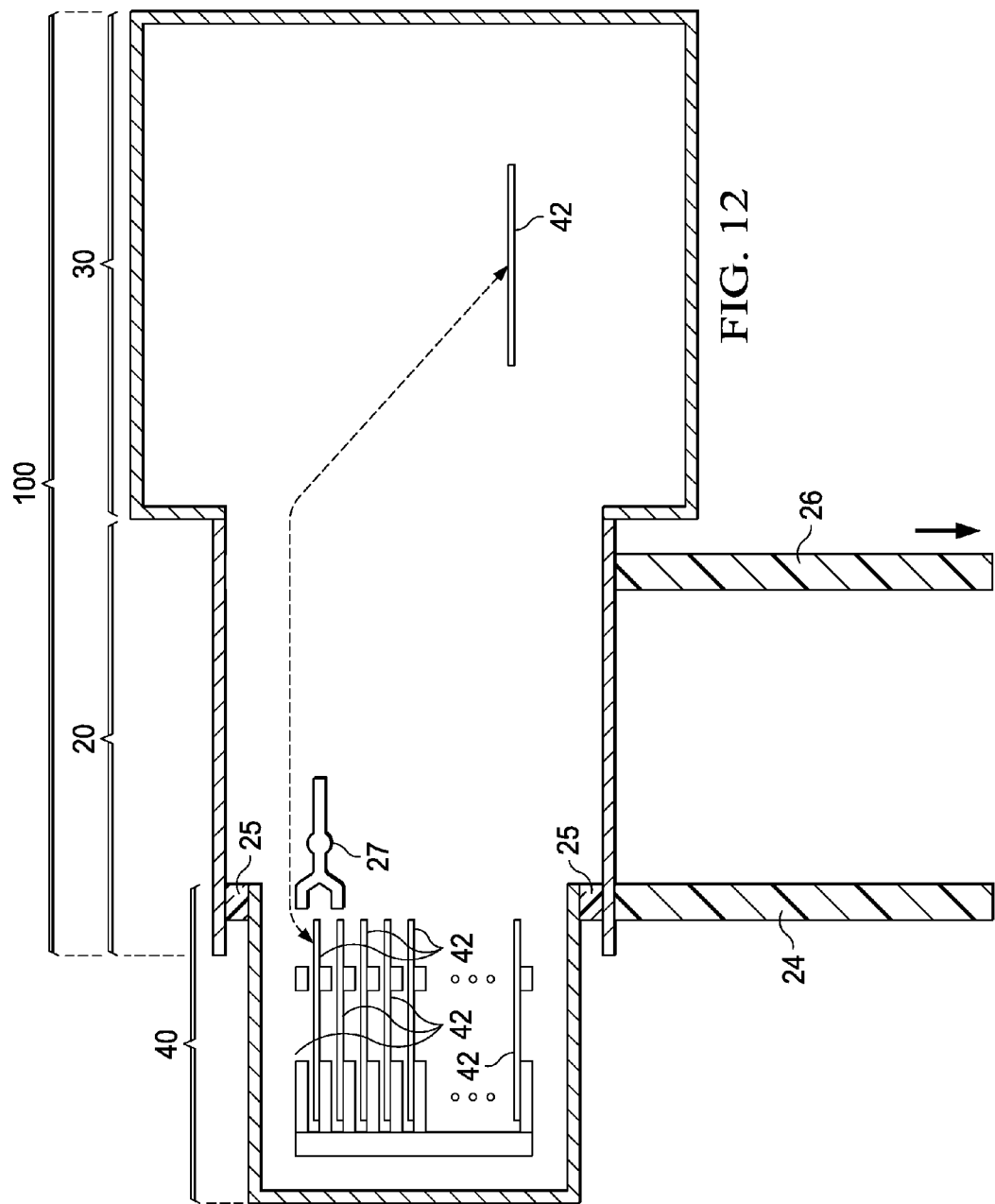

Referring to FIG. 12, when the pressure of wafer holder 40 and loadlock 20 reaches the preset low pressure, which may be lower than about 100 Torr, 10 Torr, or even lower, door 26 is opened. As a result, wafer holder 40, loadlock 20, and process chamber 30 have their inner spaces joined to share a same integrated vacuum environment, and are at a same pressure. A first wafer 42 is then transferred from wafer holder 40 into process chamber 30, so that the intended processing step such as deposition, etching, treatment, or the like, may be performed on the first wafer 42. Robot 27 may be installed in loadlock 20, and configured to transfer wafer 42 directly from wafer holder 40 to process chamber 30. During the processing of first wafer 42, process chamber 30 may be under a low pressure, which may be lower than about 100 Torr, 10 Torr, or even lower. After the processing, the first wafer 42 is transferred back to wafer holder 40, for example, using robot 27.

Figure 13:
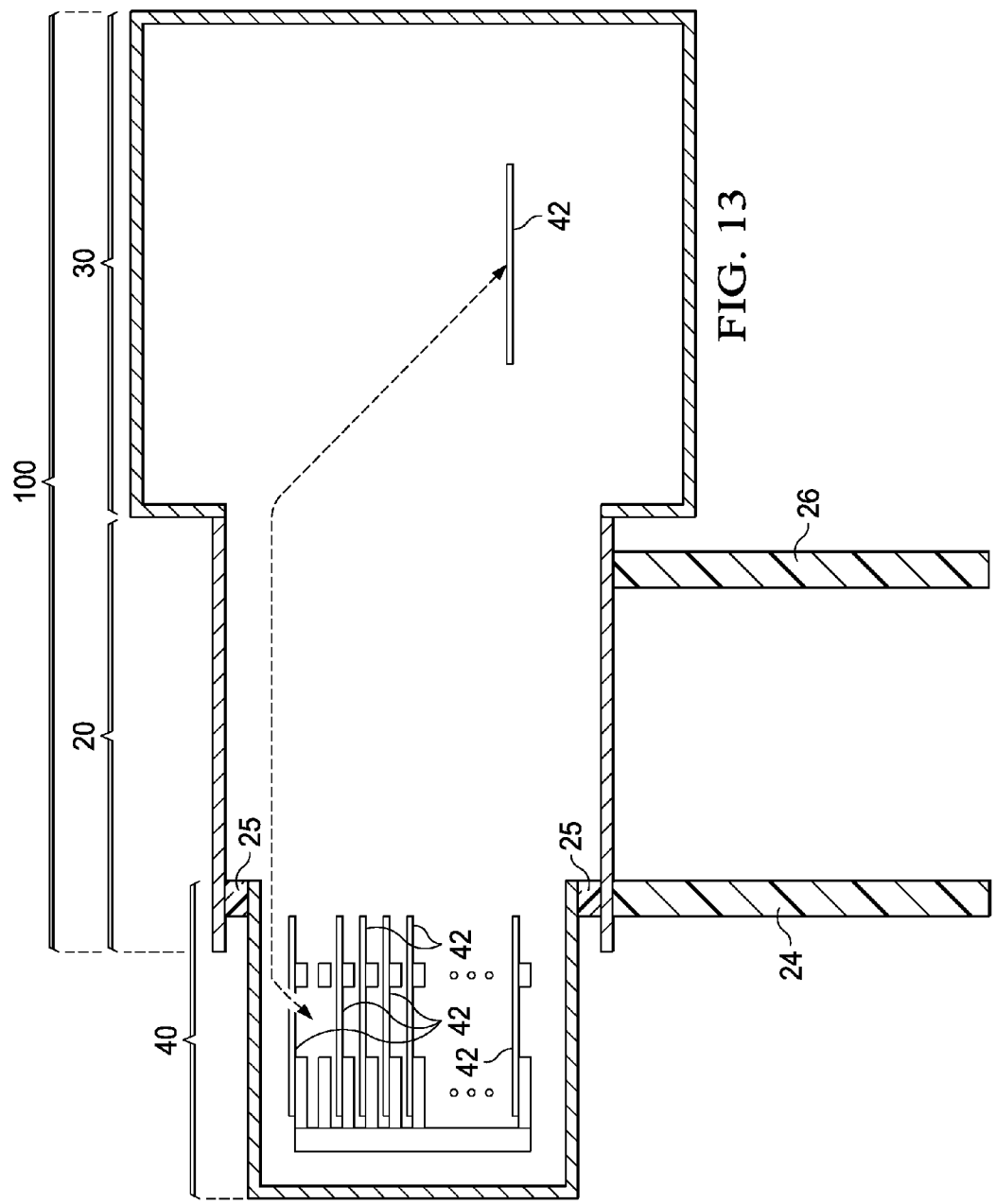

Referring to FIG. 13, a second wafer 42 is transferred from wafer holder 40 into process chamber 30, so that the intended processing step such as deposition, etching, treatment, or the like, may be performed on the second wafer 42. During the processing of second wafer 42, process chamber 30 may be at a low pressure, which may be lower than about 100 Torr, 10 Torr, or even lower. After the processing, the second wafer 42 is transferred back to wafer holder 40 directly. The process is repeated, until all wafers 42 in wafer holder 40 are transferred into process chamber 30 to perform the process, and then transferred back to wafer holder 40. Again, if process chamber 30 is able to process multiple wafers simultaneously, several wafers 42 may be transferred into process chamber 30 to perform the process simultaneously, and then transferred back to wafer holder 40, until all of wafers 42 are processed.

Figure 14:
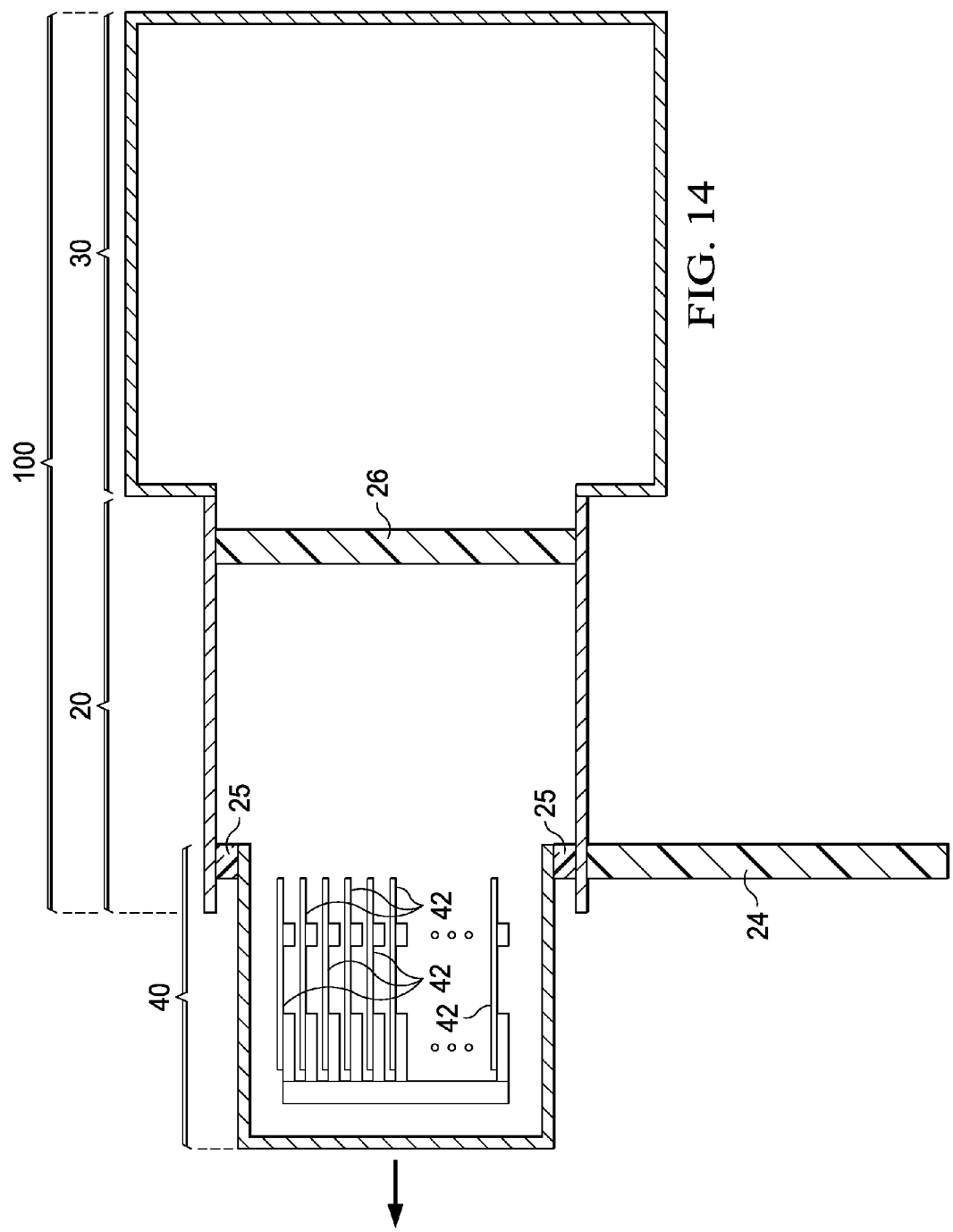
Figure 15:
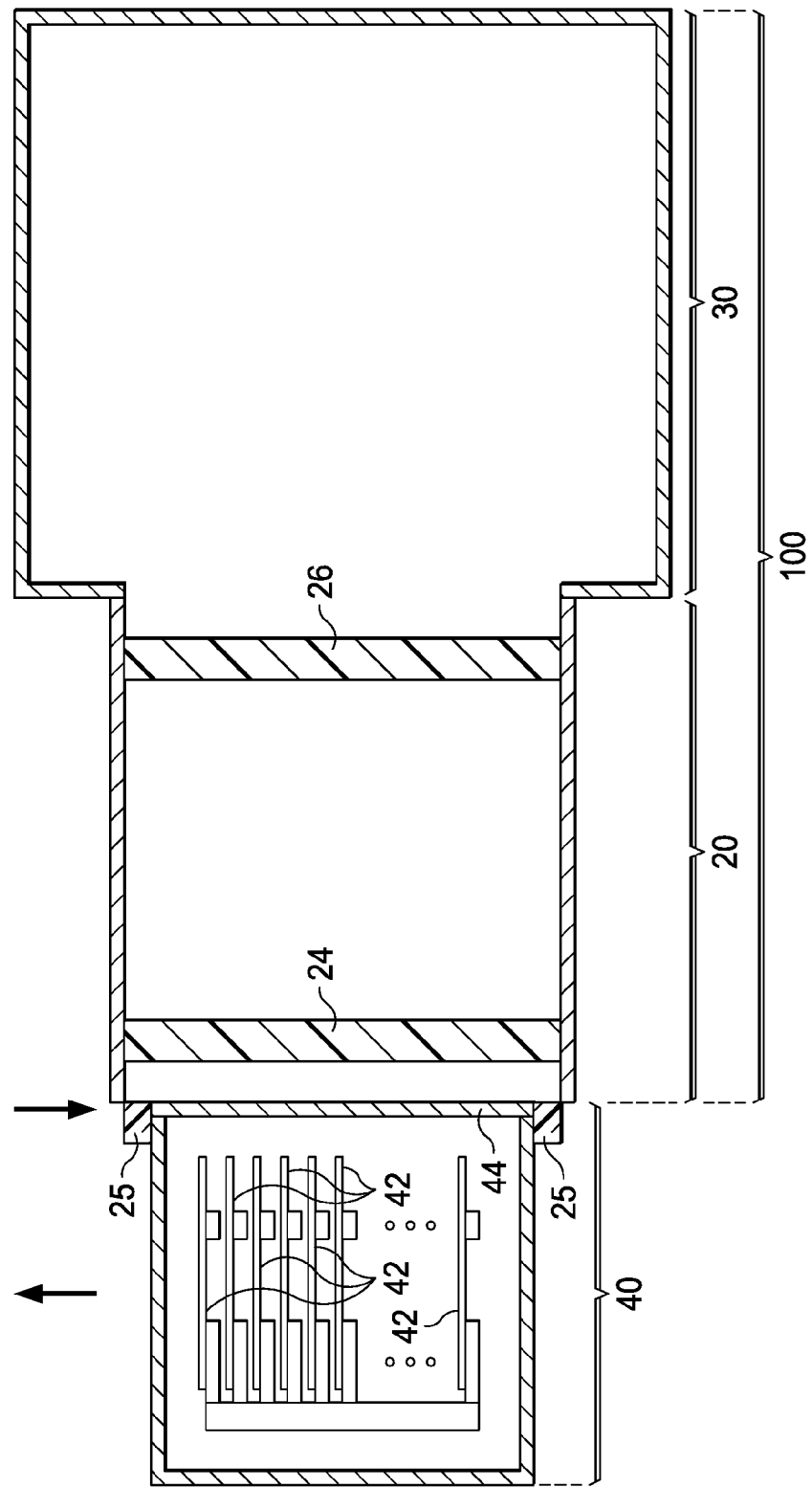

Referring to FIG. 14, door 26 of loadlock 20 is closed, and an inert gas such as nitrogen ($N_2$) is purged into loadlock 20, until the pressure in loadlock 20 reaches about one atmosphere. Wafer holder 40 is then pushed out of loadlock 20, and door 24 of loadlock 20 is closed, as shown in FIG. 15. Door 44 of wafer holder 40 is also closed. Wafer holder 40 may then be transported away, and another wafer holder (not shown) may be locked onto loadlock 20, so that the wafers in the other wafer holder may be processed.

It is observed that in the embodiments shown in FIGS. 9 through 15, during the entire period that wafers 42 are transferred into process chamber 30 and processed one by one, the rest of wafers 42 that are not being processed reside in wafer holder 40, which is vacuumed along with loadlock 20. Accordingly, detrimental substances including moisture and chemicals cannot access wafers 42, and the defects and corrosions resulted from the detrimental substances are essentially eliminated.

Figure 16:
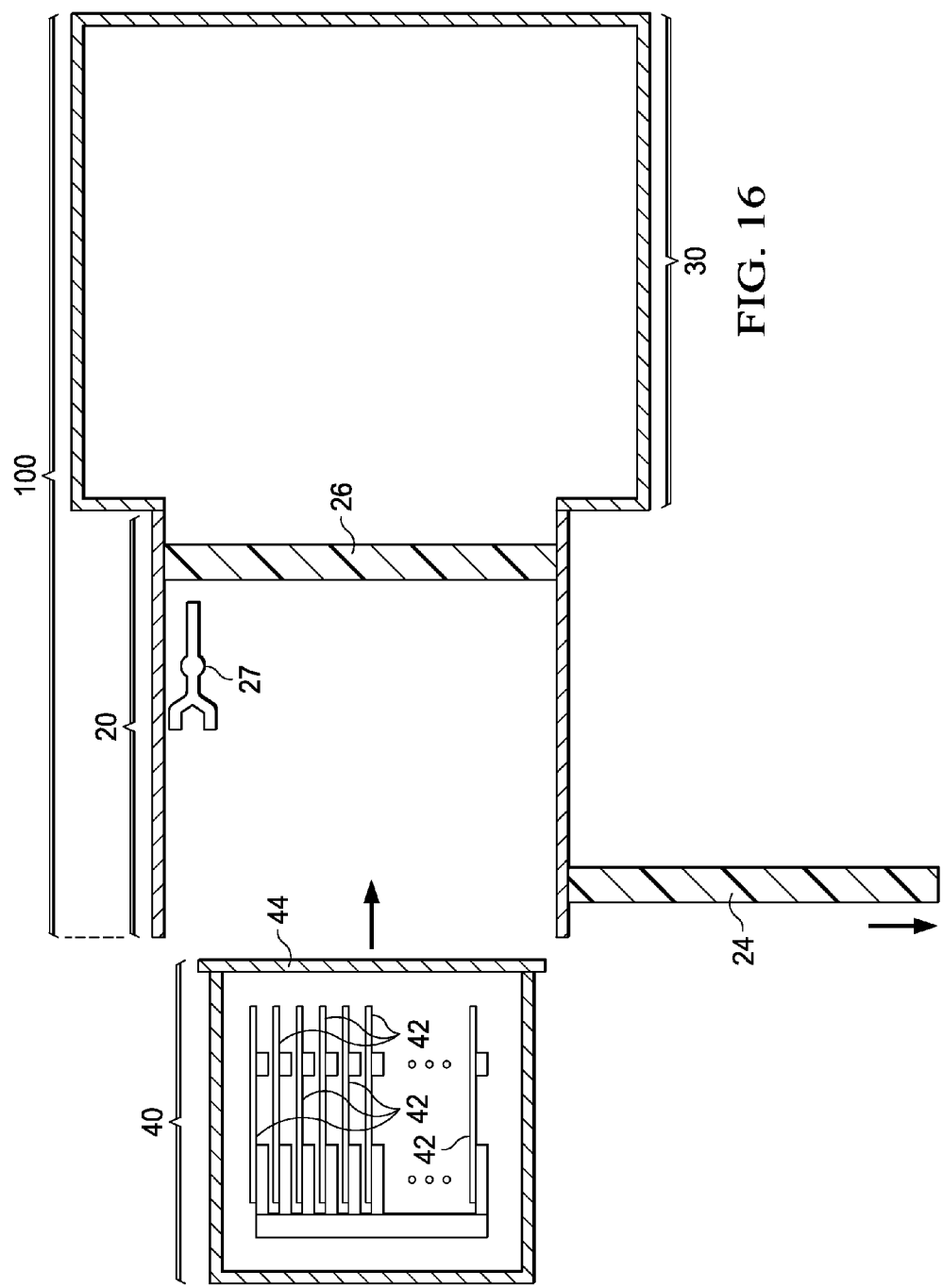
FIGS. 16 through 18 are cross-sectional views of intermediate stages in the transportation and the processing of wafers in accordance with various embodiments, wherein a wafer holder is disposed in a loadlock when the wafers are processed in a process chamber.
Figure 17:
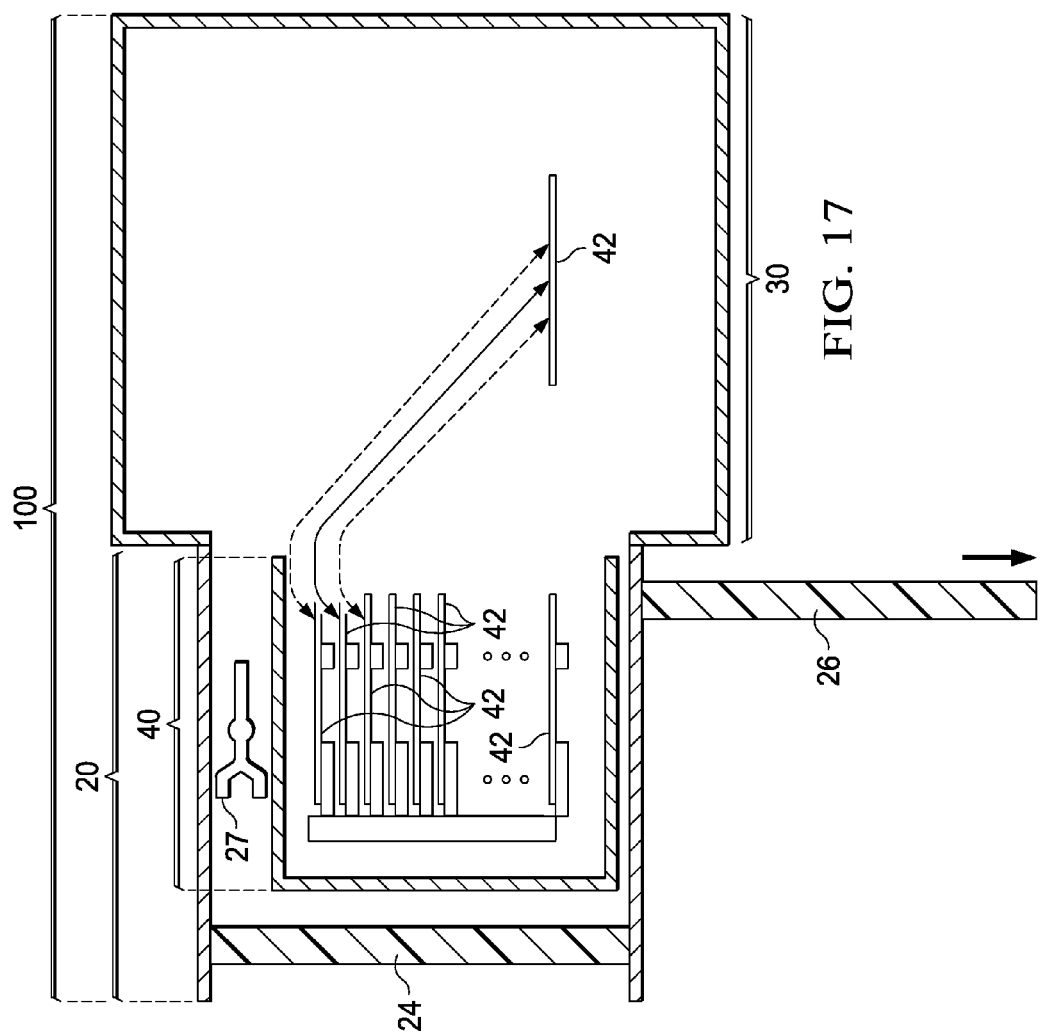
Figure 18:
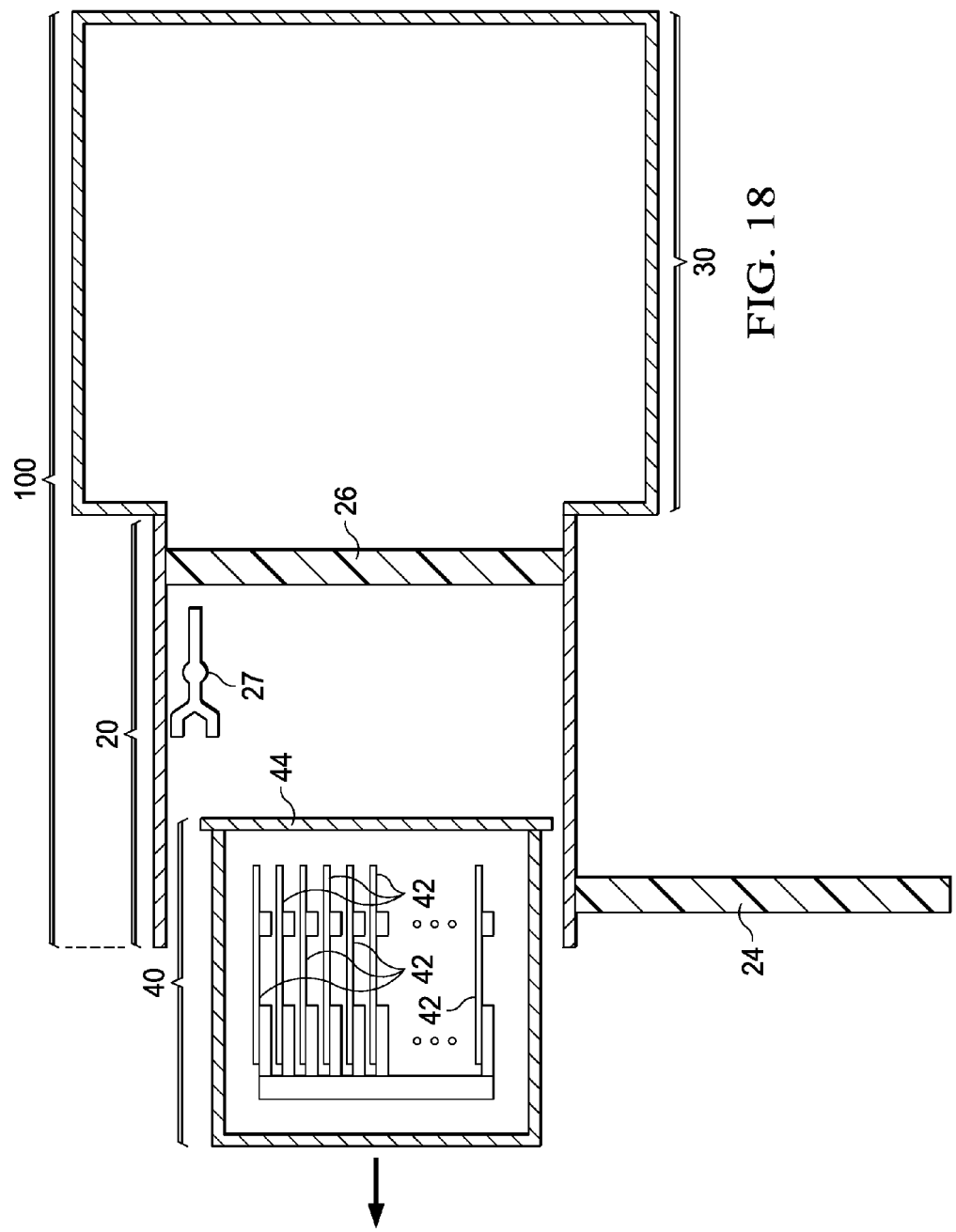

FIGS. 16 through 18 illustrate cross-sectional views of intermediate stages in the transporting and processing of wafers in accordance with yet alternative embodiments. Unless specified otherwise, the materials and formation methods of the components in these embodiments are essentially the same as the like components, which are denoted by like reference numerals in the embodiment shown in FIGS. 1 through 15.

Referring to FIG. 16, door 24 of loadlock 20 is opened, and wafer holder 40 and wafers 42 stored therein are transported into loadlock 20. Door 44 of wafer holder 40 may be opened before wafer holder 40 is transported into loadlock 20. Alternatively, door 44 may be opened after wafer holder 40 is transported into loadlock 20.

Next, referring to FIG. 17, door 24 of loadlock 20 is closed, and loadlock 20 is vacuumed. When the pressure of wafer holder 40 and loadlock 20 reaches the preset low pressure, which may be lower than about 100 Torr, 10 Torr, or even lower, door 26 is opened. As a result, wafer holder 40, loadlock 20, and process chamber 30 may have their inner spaces joined to share a same integrated vacuum environment, and may be at a same pressure. A first wafer 42 is then transferred from wafer holder 40 into process chamber 30, so that the intended processing step such as deposition, etching, treatment, or the like, may be performed on the first wafer 42. Robot 27 may be installed in loadlock 20, and configured to transfer wafer 42 directly from wafer holder 40 to process chamber 30. During the processing of first wafer 42, process chamber 30 may be under a low pressure, which may be lower than about 100 Torr, 10 Torr, or even lower. After the processing, the first wafer 42 is transferred back into wafer holder 40, for example, using robot 27.

After the processing of the first wafer 42, a second wafer 42 is transferred from wafer holder 40 into process chamber 30, so that the intended processing step such as deposition, etching, treatment, or the like, may be performed on the second wafer 42. After the processing, the second wafer 42 is transferred back into wafer holder 40 directly. The process is repeated, until all wafers 42 in wafer holder 40 are transferred into process chamber 30 to perform the process, and then transferred back to wafer holder 40.

Referring to FIG. 18, door 26 of loadlock 20 is closed, and an inert gas such as nitrogen ($N_2$) is purged into loadlock 20, until the pressure in loadlock 20 reaches about one atmosphere. Wafer holder 40 is then pushed out of loadlock 20, and door 24 of loadlock 20 is closed. Door 44 of wafer holder 40 is also closed.

In accordance with embodiments, an apparatus comprising a process chamber, a loadlock connected to the process chamber, and a wafer storage disposed in the loadlock, wherein the wafer storage is configured to store a plurality of wafers.

In accordance with other embodiments, an apparatus includes a wafer holder configured to store a plurality of wafers. The wafer holder is capable of withstanding at least a pressure difference between a first pressure inside the wafer holder, and a second pressure outside the wafer holder, with the pressure difference being greater than about one atmosphere.

In accordance with yet other embodiments, a method includes generating a vacuum environment for a tool holding a plurality of wafers therein, wherein the tool is selected from a wafer holder and a loadlock. The plurality of wafers is processed in a process chamber, wherein the step of processing includes transferring a first wafer of the plurality of wafers from the tool to the process chamber to perform a process, wherein a second wafer is left in the tool having the vacuum environment; transferring the first wafer back to the tool having the vacuum environment; transferring a second wafer of the plurality of wafers from the tool to the process chamber to perform the process, wherein the first wafer is left in the tool having the vacuum environment; and transferring the second wafer back to the tool having the vacuum environment.

In accordance with yet other embodiments, an apparatus includes a process chamber, and a loadlock connected to the process chamber. The loadlock is configured to have a wafer holder disposed therein. The wafer holder is configured to store a plurality of wafers, and is configured to transport the plurality of wafers away from the loadlock.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
    a wafer holder configured to store a plurality of wafers, wherein the wafer holder is capable of withstanding a pressure difference between a first pressure inside the wafer holder, and a second pressure outside the wafer holder, with the pressure difference being greater than one atmosphere, the wafer holder having a first door;
    sealing materials on outer sides of the wafer holder adjacent top and bottom edges of the first door;
    a process chamber;
    a loadlock connected to the process chamber, the loadlock having a second door, wherein the wafer holder and the loadlock are configured to be joined when the second door is open, wherein an end of the second door is configured to press against the sealing materials to create a sealed integrated inner space of the loadlock and the wafer holder when the second door is open, and wherein the integrated inner space is capable of being vacuumed; and
    a robot housed in the loadlock and configured to transfer the plurality of wafers directly from the wafer holder into the process chamber, and to transfer the plurality of wafers directly from the process chamber back into the wafer holder.

2. The apparatus of claim 1, wherein the loadlock is configured to hold a front portion of the wafer holder, with the front portion inserted into a front portion of the loadlock.

3. The apparatus of claim 2, wherein the second door of the loadlock comprises a sliding door configured to be opened to allow the front portion of the wafer holder to be pushed into the loadlock, and wherein the sliding door is further configured to be pressed onto a sidewall of the sealing materials on the front portion of the wafer holder to seal a joint between the loadlock and the wafer holder.

4. The apparatus of claim 1, wherein an internal space of the loadlock, an internal space of the wafer holder, and an inner space of the process chamber are joined to form the integrated inner space.

5. The apparatus of claim 1, wherein the loadlock further comprises:
a third door on an opposite end of the loadlock from the second door, wherein the third door is configured to be opened to the process chamber.

6. The apparatus of claim 1, wherein the wafer holder and the loadlock are configured to be joined with the wafer holder being outside of the loadlock.

7. The apparatus of claim 1, wherein the second door of the loadlock comprises a sliding door.

8. An apparatus comprising:
a wafer holder configured to hold a plurality of wafers, the wafer holder having a first sliding door;
a loadlock configured to connect to the wafer holder, the loadlock having a second sliding door and a third sliding door, wherein the first sliding door of the wafer holder is substantially a same size as the second sliding door of the loadlock, and wherein the first sliding door of the wafer holder is aligned with and faces the second sliding door of the loadlock such that the loadlock and the wafer holder are connected at an interface of the first sliding door and the second sliding door;
a wafer storage unit disposed in the loadlock, the wafer storage unit configured to receive the plurality of wafers from the wafer holder;
a robot housed in the loadlock, wherein the robot is configured to transport the plurality of wafers from the wafer holder to the wafer storage unit one by one; and
a process chamber connected to the loadlock at the third sliding door, the process chamber being configured to process the plurality of wafers, wherein the robot is configured to transport the plurality of wafers from the wafer storage unit into the process chamber and to transport the plurality of wafers from the process chamber back to the wafer storage unit and from the wafer storage unit back to the wafer holder.

9. The apparatus of claim 8, wherein the second sliding door of the loadlock is configured to be closed with the plurality of wafers in the loadlock.

10. The apparatus of claim 8, wherein the first sliding door is configured to slide in a first direction to open and the second sliding door is configured to slide in a second direction opposite the first direction to open.

11. The apparatus of claim 8, wherein the loadlock is configured to be vacuumed with the wafer storage unit and the plurality of wafers inside, wherein the loadlock is configured to be vacuumed to a same inner pressure as the process chamber.

12. The apparatus of claim 11, wherein the inner pressure is lower than 100 Torr.

13. The apparatus of claim 8, wherein a process for which the process chamber is configured to process the plurality of wafers comprises a deposition process, an etching process, or a treatment.

14. An apparatus comprising:
a wafer holder configured to store a plurality of wafers, wherein the wafer holder is capable of withstanding a pressure difference between a first pressure inside the wafer holder, and a second pressure outside the wafer holder, with the pressure difference being greater than one atmosphere, the wafer holder having a first door;
sealing materials on outer sides of the wafer holder adjacent top and bottom edges of the first door;
a process chamber;
a loadlock connected to the process chamber, the loadlock having a second door, wherein the wafer holder and the loadlock are configured to be joined when the second door is open, an end of the second door being configured to press against the sealing materials to create a sealed integrated inner space of the loadlock and the wafer holder when the second door is open, and wherein the integrated inner space is capable of being vacuumed; and
a robot housed in the loadlock and configured to transfer each wafer of the plurality of wafers, one by one, directly from the wafer holder into the process chamber while a same integrated vacuum environment is maintained in the integrated inner space, and to transfer the plurality of wafers directly from the process chamber back into the wafer holder while the same integrated vacuum environment is maintained in the integrated inner space.

15. The apparatus of claim 14, wherein the loadlock is configured to hold a front portion of the wafer holder, with the front portion inserted into a front portion of the loadlock.

16. The apparatus of claim 15, wherein the second door of the loadlock comprises a sliding door configured to be opened to allow the front portion of the wafer holder to be pushed into the loadlock, and wherein the sliding door is further configured to be pressed onto a sidewall of the sealing materials on the front portion of the wafer holder to seal a joint between the loadlock and the wafer holder.

17. The apparatus of claim 14, wherein an internal space of the loadlock, an internal space of the wafer holder, and an inner space of the process chamber are joined to form the integrated inner space.

18. The apparatus of claim 14, wherein the loadlock further comprises:
a third door on an opposite end of the loadlock from the second door, wherein the third door is configured to be opened to the process chamber.

19. The apparatus of claim 14, wherein the wafer holder and the loadlock are configured to be joined with the wafer holder being outside of the loadlock.

20. The apparatus of claim 14, wherein the second door of the loadlock comprises a sliding door.

* * * * *

UNITED STATES PATENT AND TRADEMARK OFFICE
CERTIFICATE OF CORRECTION

PATENT NO. : 9,997,384 B2
APPLICATION NO. : 13/309283
DATED : June 12, 2018
INVENTOR(S) : Shao-Yen Ku et al.

It is certified that error appears in the above-identified patent and that said Letters Patent is hereby corrected as shown below:

On the Title Page

Item (75) Inventors, Line 5, delete "Rui-Ping Chuang" and insert --Jui-Ping Chuang--.

Signed and Sealed this
Fourteenth Day of August, 2018

Andrei Iancu
*Director of the United States Patent and Trademark Office*